United States Patent [19]

Ashok et al.

[11] Patent Number: 4,992,415
[45] Date of Patent: Feb. 12, 1991

[54] METHOD FOR FABRICATING CERAMIC SUPERCONDUCTORS

[75] Inventors: Sankaranarayanan Ashok, Bethany; Bruce M. Guenin, Guilford, both of Conn.

[73] Assignee: Olin Corporation, New Haven, Conn.

[21] Appl. No.: 80,718

[22] Filed: Jul. 31, 1987

[51] Int. Cl.$^5$ .................. H01L 39/12; H01L 5/08; H01L 39/24

[52] U.S. Cl. ........................ 505/1; 419/9; 419/19; 419/29; 419/36; 419/57; 505/728; 505/736; 505/740

[58] Field of Search ............... 419/19, 20, 9, 29, 38, 419/57; 75/235, 233, 234; 428/552; 505/1, 728, 736, 740

[56] References Cited

U.S. PATENT DOCUMENTS

| | | | |
|---|---|---|---|
| 3,024,110 | 3/1962 | Funkhouser et al. | 75/234 |
| 3,301,643 | 1/1967 | Cannon et al. | 75/234 |
| 4,127,700 | 11/1978 | Stock et al. | 75/232 |
| 4,715,892 | 12/1987 | Mahulikar | 75/233 |
| 4,826,808 | 5/1989 | Yurek et al. | 505/1 |
| 4,892,861 | 1/1990 | Ray | 505/1 |

OTHER PUBLICATIONS

Japanes Journal of Applied Physics, Jul. 1987; Kumakura et al.; "Ba-Y-Cu-O Superconducting Tape Prepared by Surface Diffusion Process", pp. L1172-L1173.

Advanced Ceramic Materials, Jul. 1987; McCallum et al.; "Ceramic Superconductors", pp. 388-400.

Dagani, Ron, "Superconductivity: A Revolution in Electricity is Taking Shape", *Chemical and Engineering News*, May 11, 1987, pp. 7-16.

Cava et al., "Bulk Superconductivity at 91K in Single--Phase Oxygen Deficient Perovskite $Ba_2YCu_3O_9-\delta$", *Physical Review Letters*, vol. 58, No. 16, (Apr. 20, 1987), pp. 1676-1679.

Bednorz, J. G. and Muller, K. a., "Possible High $T_c$ Superconductivity in the Ba-La-Cu-O System", *Condensed Matter*, vol. 64, (1986), pp. 189-193.

Gruen et al., "Formation of Perovskite Surface Layers by Oxidation of Cu-La-Sr Alloys", *Journal of Electrochemical Society*, vol. 134, No. 6 (Jun. 1987), pp. 1588-1589.

Robinson, Arthur L., "A New Route to Oxide Superconductors", *Science*, vol. 236, (Jun. 1987), p. 1526.

Kenward, Michael, "The Heat is on for Superconductors", *New Scientist*, (May 7, 1987), pp. 46-51.

Smith, E. T. et al., "Putting Superconductors to Work-Super Fast", *Business Week*, (May 8, 1987), pp. 124-126.

*Primary Examiner*—Stephen J. Lechert, Jr.
*Attorney, Agent, or Firm*—Gregory S. Rosenblatt; Paul Weinstein

[57] ABSTRACT

A method for fabricating a ceramic superconductor comprising the following steps: mixing a copper or copper alloy metal, a first metal oxide or carbonate which includes one element selected from group IIA of the Chemical Periodic Table, and a second metal oxide or carbonate which includes one element selected from group IIIB of the Chemical Periodic Table to form a copper/ceramic mixture; heting a copper/ceramic mixture to a temperature in the range between 900°-1100° C.; and cooling the heated copper/ceramic mixture slowly, thereby forming a superconductive material. The copper/ceramic mixture may be extruded through a die prior to the heating step, thereby forming a superconductor of desired shape.

15 Claims, No Drawings

METHOD FOR FABRICATING CERAMIC SUPERCONDUCTORS

The present invention relates to a unique method for fabricating superconducting ceramics. It provides for the fabrication of superconducting material into practical shapes, such as wires, coils, electrical circuits and foils. Wires and other shapes are fabricated in accordance with the present invention by replacing the copper oxide component of the mixture used to form the superconducting material with a copper or copper alloy metal. The copper metal is thereafter combined with the other elements which are selected from groups IIA and IIIB of the Chemical Periodic Table, sintered at a temperature in the range between about 900–1100° C., and then slowly cooled, thereby forming a superconductive material. It is preferable that the elements from groups IIA and IIIB be in the form of oxides or carbonates, and that the copper/ceramic mixture be shaped at room or elevated temperature prior to the sintering step.

The recent discovery of a composition having superconductive properties at temperatures above the boiling point of liquid nitrogen has prompted great interest in the scientific community and dreams of low-cost medical imaging, faster computers and levitated trains. A material is considered superconductive if it conducts electricity with no resistance and excludes the flux lines of a magnetic field (Meissner Effect). Ordinary materials that conduct electricity, like copper wire, also resist its flow, wasting valuable energy as heat, e.g. producing a loss of approximately 15% of generated electrical power in the United States. Since superconductors have no such resistance, the use of superconducting materials as wires, integrated circuits, and magnetic coils has the potential of revolutionizing the electrical and electronic industries, similar to the development of the light bulb and transistor.

Superconductivity was first discovered in 1911, when a group of scientists found that mercury lost its electrical resistance when cooled to 4° K. Unfortunately, it is extremely expensive and impractical in commercial application to maintain the superconductive properties at such low temperatures. Over the years, researchers have discovered various new superconducting materials and gradually pushed up the transition temperature, known as the critical temperature $T_c$, below which a material exhibits superconductive properties. More recently, an alloy of germanium-niobium ($Nb_3Ge$), was discovered to have superconductive properties at 23.3° K. Again, maintaining this low temperature was both costly and commercially unacceptable. In 1986 a tremendous break-through occurred when a composition of La-Ba-Cu-O was discovered to have superconductive properties at temperatures below 35° K. Shortly thereafter derivations of the ceramic superconductor were developed to a point that superconductive properties have been seen at temperatures as high as 90° K. Although far below room temperature, the operating conditions of the recently discovered ceramic superconductors permits cooling by liquid nitrogen which is far less expensive than liquid hydrogen or helium, which were required to maintain the lower temperatures of the earlier superconductors.

The general composition $ZW_2Cu_3O_x$ of the new ceramic superconductor is related to a class of minerals called perovskites, wherein Z is one element selected from group IIIB of the Chemical Periodic Table, W is one element selected from group IIA of the chemical periodic table, is an integer between 6.5–7.5. Moreover, these metal oxide ceramic superconductors are a distorted, oxygen deficient form of perovskites but with a layered structure not seen in naturally occurring minerals. The structure consists of near-planar arrays of copper and oxygen atoms interspersed with layers of elements from groups IIA and IIIB, such as barium (Ba) and yttrium atoms, respectively. The copper atoms exist in different valence states, such as copper (+2) and copper (+3). Furthermore, the number of oxygen atoms also varies so that the oxygen total negative charge balances the metals positive charge.

As one group of scientists continues to search for materials which exhibit superconductive properties at room temperature, others are busy looking to bring these newly discovered superconductive materials into commercial application.

The primary problem with these materials is their brittleness and poor formability. This inability to fabricate required shapes using these ceramic superconductive materials has slowed the pace of progress towards commercial application thereof.

Commercial applications for this superconductive material are expected to be in the electrical and electronic industries, i.e. wires, magnetic coils, sheets, conductors and circuitry. Thus, until scientists are able to fabricate this superconductive material into the necessary commercial forms its usefulness to society will be minimal.

There are currently three preferred methods for making ceramic semiconductors. The most often used method is to mix $BaCO_3$, $Y_2O_3$, and $CuO$; heat the mixture at temperatures between 900° and 1100° C.; press the mixture into pellets and sinter at high temperatures for several hours; and cool to a low temperature of 200° C. The cooling step is often followed by annealing at a temperature in the range between 400–700° C. In most instances the aforementioned heating and sintering shall take place in an oxidizing atmosphere. See Dagani, Ron, "Superconductivity: A Revolution in Electricity is Taking Shape", *Chemical and Engineering News*, May 11, 1987, pp. 7–16; and Cava et al, "Bulk Superconductivity at 91K in Single-Phase Oxygen Deficient Perovskite $Ba_2YCu_3O_{9-\delta}$", *Physical Review Letters*, Vol 58, No. 16, (Apr. 20, 1987), pp. 1676–1679.

Superconductive materials formulated in accordance with the above method are extremely brittle superconductors which cannot be fabricated into fine electrical components, such as wires, coils or circuitry. This is a common problem with most ceramics. Furthermore, all the starting materials are compounds which are extremely brittle as well. Thus, the poor formability of superconductive material, or its starting components, made in accordance with the above process is extremely undesirable and commercially unacceptable.

In Bednorz, J. G. and Muller, K. A., "Possible High $T_c$ Superconductivity in the Ba-La-Cu-O System", *Condensed Matter*, Vol. 64, (1986), pp. 189–193, superconductive material was prepared by a coprecipitation method from aqueous solutions of Ba-, La-, Cu-nitrate in their appropriate ratios. When added to an aqueous solution of oxalic acid as the precipitant, an intimate mixture of corresponding oxalates was formed. Decomposition of the precipitate and the solid-state reaction were performed by heating at 900° C. for 5 hours. The product was pressed into pellets and reheated to 400° C.

for sintering. Just like the other processes the coprecipitation method resulted in the formation of a brittle and non-ductile superconductor product.

The third process for preparing this new class of superconductor material comprises mixing Cu, La, and Sr metals, and thereafter melting in a crucible under helium, thereby forming an alloy of composition $La_{1.85}Sr_{0.15}CuO_4$. This alloy was thereafter heated in air, with the temperature slowly raised over a 24 hour period to 800° C. See Gruen et al, "Formation of Perovskite Surface Layers by Oxidation of Cu-La-Sr Alloys", *Journal of Electrochemical Society*, Vol. 134, No. 6, (June 1987), pp. 1588-9. Similar to the first process the superconductor product formed in accordance with the immediate process was brittle and silver colored. Additionally, the use of elemental metals to form superconductors is extremely expensive.

In order to overcome the non-ductile property of these ceramic superconductors scientists have attempted to fabricate commercially acceptable shapes by rapid solidification of a stream of molten alloy on a spinning metal wheel thereby forming a continuous thin ribbon. After shaping, the highly reactive alloy is heated in an oxygen atmosphere in an effort to form a ceramic superconductor. See Robinson, Arthur L., "A New Route to Oxide Superconductors", *Science*, Vol. 236, (June 1987), pg. 1526. Another approach is to plasma coat preformed wires, contoured surfaces, and tubes with thin layers of superconducting ceramics. See Kenward, Michael, "The Heat is on for Superconductors", *New Scientist*, (May 7, 1987), pp. 46-51. Still others have attempted to fabricate wires by extruding a combination of ceramic oxide and plastic or other binder into a wire, or other coil shape, and subsequently firing which results in the formation of a brittle wire. See Smith, E. T. et al, "Putting Superconductors to Work-Super Fast", *Business Week*, (May 18, 1987), pp. 124-126.

The present inventors have developed a novel method for preparing a superconductive material which can be formed into many commercially desirable shapes, e.g. wires, coils, foil sheets, conductors and electronic circuitry. The present inventors have discovered that a more ductile mixture may be formed by mixing a copper or copper alloy metal with metal oxides or carbonates from groups IIA and IIIB of the Chemical Periodic Table, wherein copper or copper alloy metal replaces brittle copper oxide. The advantage to using copper metal is strength and ductility. Furthermore, it was discovered that copper metal permitted the use of much cheaper ceramic oxides and/or carbonates from groups IIA and IIIB, rather than the expensive rare earth metals previously used. Additional advantages of the present invention shall become apparent as described below.

Thus, it is a primary object of the present invention to provide a method of fabricating ceramic superconductors comprising the following steps: mixing a copper or copper alloy metal, a first metal oxide or carbonate comprising an element selected from group IIA of the Chemical Periodic Table, and a second metal oxide or carbonate comprising an element selected from group IIIB of the chemical periodic table, to form a copper/ceramic mixture; sintering the copper/ceramic mixture at a temperature in the range between about 900–1100° C.; and cooling the sintered copper/ceramic mixture slowly, thereby forming a superconductor material.

It is preferable that the copper/ceramic mixture be shaped prior to the sintering step, wherein the ductile copper metal permits the forming of commercially desirable shapes. After sintering the copper metal in the copper/ceramic mixture is converted into a brittle superconductor which makes further fabrication difficult.

Optionally, the method according to the present invention may also include an additional step of annealing the superconductor material at a temperature in the range between about 400–700° C. subsequent to the cooling step. Furthermore, the copper metal is either elemental copper, a copper alloy or a combination thereof. The copper is typically in a particulate form, but as will be described below may also be a preformed wire, coil or other shaped component. The group IIA oxide or carbonate may be, for example, $BeCO_3$, $MgCO_3$, $CaCO_3$, $SrCO_3$, $BaCO_3$, $RaCO_3BeO$, $MgO$, $CaO$, $SrO$, $BaO$, and $RaO$, preferably $BaCO_3$. The group IIIB oxide or carbonate may be, for example, $Sc_2(CO_3)_3$, $Y_2(CO_3)_3$, $La_2(CO_3)_3$, $Ac_2(CO_3)_3$, $Sc_2O_3$, $Y_2O_3$, $La_2O_3$, and $Ac_2O_3$, preferably $Y_2O_3$ or $La_2O_3$.

Additionally, it is an object of the present invention that the sintering step above occur in an oxidizing and/or fluoridizing atmosphere.

It is also an object of the present invention that a ceramic superconductor be fabricated by depositing a first metal oxide or carbonate and a second metal oxide or carbonate onto a preformed copper metal, e.g. copper wire, to form a ceramic/copper structure; sintering the ceramic/copper structure at a temperature in the range between 900–1100° C.; and cooling the sintered ceramic/copper structure slowly, thereby forming a superconductor of desired shape. The first metal oxide or carbonate compound may be selected from oxides or carbonates of the elements of group IIA of the Chemical Periodic Table. Similarly, the second metal oxide or carbonate may be one selected from the group of oxides or carbonates of the elements of group IIIB of the Chemical Periodic Table.

It is preferable that the copper metal be a wire, coil, foil or any other desirable shape. Since the copper metal is ductile it may be preformed into any desired shape for commercial application prior to sintering and oxidation to copper oxide. Again, the sintering step may occur in an oxidizing and/or fluoridizing atmosphere as above.

Thus, a copper wire may have selected metal oxides or carbonates plated or deposited thereon by standard deposition techniques, and thereafter subjecting the plated wire to sintering, whereby a superconductor of desired shape is formed. The amount of oxygen, metal oxide and duration of the heating step can be adjusted such that only the surface or near the surface of the copper metal is transformed into a superconductive material such that the core remains a copper metal. This would give additional support and act as a backup conductor should the superconductive material become unconductive or resistive to electricity. It is also envisioned that a metallic powder, e.g. copper, may be deposited together with the first and second metal oxides and/or carbonates to permit additional ductility.

Electronic circuitry may also be prepared in accordance with the present invention, i.e. a copper metal foil, plated with metal oxides or carbonates, is sintered and cooled to form a superconductor foil which thereafter has a patterned photoresist applied thereto such that the exposed portions of the superconductor foil may be etched away by standard etching techniques. It is also possible to etch the copper foil prior to deposition of the first and second metal oxide or carbonate layers. Electronic circuitry may also be formed from copper metal foil by first oxidizing the foil and then depositing the first and second metal oxide or carbonate layers in a desired pattern by screen printing. Again, the first and second metal oxides and/or carbonates may be combined with a metallic powder to permit greater formability.

The forming of the new "hi-temperature" superconducting copper oxides into wire and other forms is a difficult problem due to their lack of ductility. The present invention provides for fabrication of superconducting ceramic materials to desirable shapes by incorporating a ductile copper or copper alloy metal into the regions separating the ceramic particles. The copper or copper alloy metal is then subjected to appropriate processing to transform it into an oxide of copper with a composition appropriate for superconductivity. The fact that this new class of superconductors are brittle ceramics, however, offers a substantial challenge in forming wires and other shapes from these materials. Fabrication of the superconducting material into various forms will be required in most commercial applications.

The method of forming a ceramic superconductor according to the present invention comprises the following steps: mixing a copper or copper alloy metal, a first metal oxide or carbonate which includes an element selected from group IIA of the Chemical Periodic Table, and a second metal oxide or carbonate which includes an element selected from group IIIB of the Chemical Periodic Table, to form a copper/ceramic mixture; sintering the copper/ceramic mixture at a temperature in the range between about 900-1100° C.; and cooling the sintered copper/ceramic mixture slowly, thereby forming a superconductive material. The mixing of the copper metal and the metal oxides or carbonates, from groups IIA and IIIB of the Chemical Periodic Table, can be done by any standard grinding, ballmilling or stirring technique. The sintering of the copper/ceramic mixture takes place in an oven capable of heating temperatures at least in the range between 900-1100° C. The sintering takes place for up to twenty-four hours. The cooling step is extremely important in the formation of the material's superconductive properties which requires slow cooling, e.g. 1-2° C. per minute. This slow cooling may be accomplished by leaving the material in the oven.

It is preferable that the sintering step occur in an oxidizing and/or fluoridizing atmosphere in order to assure that the material being formed includes a sufficient amount of oxygen and/or fluorine atoms.

If a preformed wire or other copper metal shape is used instead of particulate copper metal then the mixing step would be replaced by a means of depositing or plating metal oxides or carbonates onto the surface of the copper or copper alloy. The deposition step can be any standard vapor deposition, plasma deposition, plating or slurry coating technique suitable for the object upon which the elements are being deposited.

Sintering of the copper wire coated with a slurry of metal oxides or carbonates could be interrupted, resulting in the formation of a superconductor wire having a shell of superconductive material and a copper metal core. One advantage of leaving a metallic core is that it could act as an electrical shunt to the superconductor to deal with resistivity transients which occur in type 2 superconductors. The core could also serve to conduct heat away from the region in which the transient occurred to prevent excessive heating in that region. Also, since the core is assumed to have a higher coefficient of thermal expansion than the ceramic shell and the shell was formed at elevated temperatures, at room temperature or below, the metallic core exerts an axially compressive stress on the ceramic shell. This serves to make the wire more resistant to having external stresses producing a fracture in the brittle superconductor and reducing its current-carrying capacity.

In the instance where particulate copper or copper alloy is mixed with ceramic oxides or carbonates it is most preferable that the copper/ceramic mixture be extruded through a shaping die to form a composite wire, coil, conductor or any other desired structure prior to the sintering step. The ductility of the copper metal permits shaping, whereas subsequent to sintering the copper metal oxidizes to a non-ductile copper oxide which is not suitable for fabrication. In either case, it may be desirable to follow the cooling step by annealing the superconductive material at a temperature in the range between 400-700 ° C.

In the situation where a copper or copper alloy particulate is used it is mixed with the metal oxides or carbonates, which are also in powder form, such that the amount of copper metal added is sufficient to ensure that the powder mass can plastically deform under reasonably applied pressures. The mixture can then be extruded through a fabricating die to form a composite wire of appropriate diameter or other desired shapes. The wire would then be heat-treated to transform the copper metal into a copper oxide of a composition with appropriate superconducting properties, e.g. $YBa_2Cu_3O_x$. In order to accomplish this transformation, oxygen and appropriate elements from groups IIA and IIIB, such as $BaCO_3$ and $Y_2O_3$, respectively, any other additional elements are supplied to the copper matrix via solid-state diffusion. Traditionally, oxygen or fluorine are supplied to the copper or copper alloy metal by conducting the sintering step in an oxidizing or fluoridizing atmosphere at a temperature in the range between about 900-1100° C.

The present invention also permits the fabrication of electronic circuitry having superconductive properties by either forming a superconductive foil and thereafter etching away the desired circuit design; depositing the ceramic oxides onto a copper metal foil having a patterned photoresist applied thereto and thereafter etching away the unexposed portions; or first oxidizing the copper foil and thereafter depositing the metal oxides or carbonates thereon in a desired pattern by screen printing.

In order to realize the full potential of high temperature superconductors, an electrical interconnect must be developed. The present invention provides for the application of patterned photoresists and standard etching techniques to fabricate a circuitry of the superconducting material. The circuitry can be used in printed wiring boards and TAB tapes. One method of fabricating a thin layer or foil of superconductive material is to transform a copper foil to $YBa_2 Cu_3O_x$ by applying appropriate dopants, e.g. $BaCO_3$ and $Y_2O_3$, to the foil surface and heating in an oxidizing or neutral atmosphere at a temperature in the range between about 900-1100° C. Thereafter, a patterned photoresist is applied to the superconductor foil, whereby the exposed portions may be etched away by known etching techniques.

It is also possible to first oxidize the copper foil, apply appropriate metal oxides or carbonates in a final desired pattern by a screen printing process, sintering the impregnated foil at a temperature in the range between about 900–1100° C., slowly cooling the sintered foil to form a superconductor foil, and etch away undoped areas. In some instances it may be preferable not to apply the etching process because the presence of finite resistances shunting the superconducting pattern may not effect the circuit's performance. Additionally, a superconductor circuit may also be fabricated by applying a photoresist of a desired pattern to a copper foil, etching away uncovered portions of the foil, applying metal oxides or carbonates to the surface of the foil, sintering the foil in an oxidizing atmosphere at a temperature in the range between about 900–1100° C., and slowly cooling the sintered foil.

EXAMPLE 57.19 grams of Copper, 118.41 grams of barium carbonate and 33.87 grams of yttria were ground together for thirty minutes in a mortar and pestal. The ground mixture was thereafter compacted at 40 ksi to a pellet. The pellet was heated at 100° C. per hour to 925° C., held at that temperature for 16 hours, and furnace cooled. The sintered pellet was cooled to liquid nitrogen temperature and brought near a magnet. The pellet was repelled by the magnet indicating Meissner Effect. The pellet was again heated slowly to 700° C., held at that temperature for 16 hours and furnace cooled. Again, it was successfully tested for Meissner Effect after cooling to liquid nitrogen.

We have shown and described several embodiments in accordance with our invention, it is to be clearly understood that the same are susceptible to numerous changes and modifications apparent to one skilled in the art. Therefore, we do not wish to be limited to the details shown and described but intend to cover all such changes and modifications which come within the scope of the appended claims.

what is claimed is:

1. A method of fabricating a ceramic superconductor comprising the following steps:
   mixing copper or copper alloy metal particulate, a first metal oxide or carbonate selected from the group consisting of $SrCO_3$, $BaCO_3$, SrO and BaO, and a second metal oxide or carbonate selected from the group consisting of $Y_2(CO_3)_3$, $La_2(CO_3)_3$, $Y_2O_3$ and $La_2O_3$ to form a copper/ceramic mixture;
   heating said copper/ceramic mixture at a temperature in the range between about 900–1100° C.; and
   cooling the heated copper/ceramic mixture slowly, thereby forming a superconductive mixture.

2. The method according to claim 1, wherein said cooling step is followed by annealing said superconductive material at a temperature in the range between about 400–700° C.

3. The method according to claim 1, wherein said copper/ceramic mixture is shaped to form a composite wire or any other shape prior to said heating step.

4. The method according to claim 1, wherein said heating step occurs in an oxidizing and/or fluoridizing atmosphere.

5. The method of claim 3 wherein said copper/ceramic mixture is shaped by extruding through a die.

6. A method of fabricating a ceramic superconductor comprising:
   depositing a first metal oxide or carbonate selected from group consisting of $SrCo_3$, $BaCO_3$, SrO and BaO, and a second metal oxide or carbonate selected from the group consisting of $Y_2(CO_3)_3$, $La_2(CO_3)_3$, $Y_2O_3$ and $La_2O_3$, onto a copper or copper alloy metal structure to form a ceramic/copper structure;
   heating said ceramic/copper structure at a temperature in the range between about 900–1100° C.; and
   cooling the heated ceramic/copper structure slowly, thereby forming a superconductive material.

7. The method according to claim 6, wherein said cooling step is followed by annealing said superconductor at a temperature in the range between about 400–700° C.

8. The method of claim 6 wherein said first metal oxide or carbonate is selected from the group consisting of $SrCO_3$, SrO and BaO and said second metal oxide or carbonate is selected from the group consisting of $Y_2(CO_3)_3$, $La_2CO(_3)_3$ and $La_2O_3$.

9. The method according to claim 8, wherein the copper or copper alloy metal structure is a wire, coil, foil, conductor, or any other desirable shape.

10. The method according to claim 8, wherein said heating step occurs in an oxidizing and/or fluoridizing atmosphere.

11. The method according to claim 8, wherein the heating occurs only long enough to form a superconductive shell about said ceramic/copper structure, such that the core is a copper or copper alloy metal.

12. The method according to claim 9, wherein the copper or copper alloy metal structure is a foil and a patterned photoresist is applied to the foil of superconductive material subsequent to said cooling step, wherein the exposed portions of said superconductor foil are etched away.

13. The method according to claim 9, wherein the copper or copper alloy metal structure is a foil and a patterned photoresist is applied to said foil prior to the step of depositing said first and second metal oxides and/or carbonates thereon, wherein the unexposed portions of said foil are etched away.

14. The method according to claim 9, wherein said copper or copper alloy metal structure is a foil which has been oxidized and thereafter has said first and second metal oxides and/or carbonates deposited thereon in a desired pattern by screen printing.

15. The method according to claim 14, wherein the undoped areas of said foil are etched away subsequent to said heating and cooling steps.

* * * * *